United States Patent
Cheng et al.

(10) Patent No.: US 8,574,970 B2
(45) Date of Patent: Nov. 5, 2013

(54) METHOD OF FORMING AN EXTREMELY THIN SEMICONDUCTOR INSULATOR (ETSOI) FET HAVING A STAIR-SHAPED RAISED SOURCE/DRAIN

(75) Inventors: Kangguo Cheng, Guilderland, NY (US); Bruce B. Doris, Brewster, NY (US); Ali Khakifirooz, Mountain View, CA (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 527 days.

(21) Appl. No.: 12/882,490

(22) Filed: Sep. 15, 2010

(65) Prior Publication Data
US 2012/0061759 A1   Mar. 15, 2012

(51) Int. Cl.
*H01L 21/84* (2006.01)
(52) U.S. Cl.
USPC ..... 438/151; 438/155; 438/300; 257/E21.619
(58) Field of Classification Search
CPC ............. H01L 29/66628; H01L 29/66772; H01L 29/78654
USPC .......... 438/300, 151, 155; 257/401, E21.619, 257/E21.634
See application file for complete search history.

(56) References Cited

U.S. PATENT DOCUMENTS

| | | | |
|---|---|---|---|
| 6,429,084 B1 * | 8/2002 | Park et al. | 438/305 |
| 7,736,957 B2 * | 6/2010 | Grudowski et al. | 438/153 |
| 2008/0220579 A1 * | 9/2008 | Pal et al. | 438/265 |
| 2008/0299724 A1 * | 12/2008 | Grudowski et al. | 438/257 |

\* cited by examiner

*Primary Examiner* — Kenneth Parker
*Assistant Examiner* — Jose R Diaz
(74) *Attorney, Agent, or Firm* — H. Daniel Schnurmann

(57) ABSTRACT

A MOSFET device is formed on top of a semiconductor-on-insulator (SOI) substrate having a semiconductor layer with a thickness ranging from 3 nm to 20 nm. A stair-shape raised extension, a raised source region and a raised drain region (S/D) are formed on top of the SOI substrate. The thinner raised extension region abuts at a thin gate sidewall spacer, lowering the extension resistance without significantly increasing the parasitic resistance. A single epitaxial growth forms the thinner raised extension and the thicker raised S/D preferably simultaneously, reducing the fabrication cost as well as the contact resistance between the raised S/D and the extension. A method of forming the aforementioned MOSFET device is also provided.

9 Claims, 3 Drawing Sheets

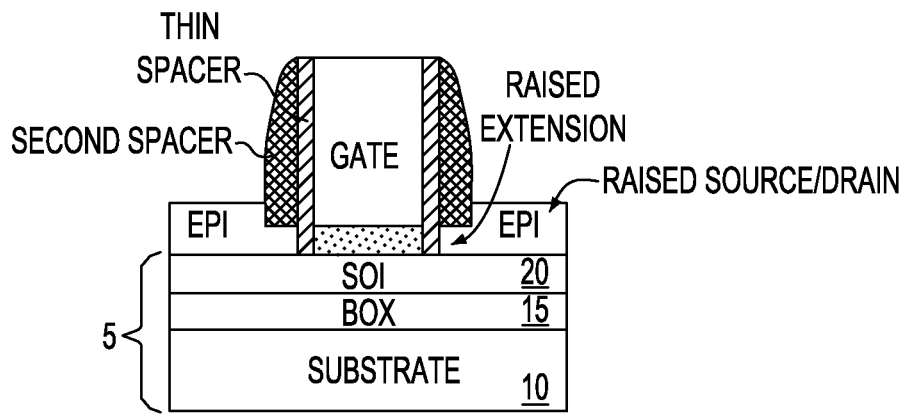
FIG. 1
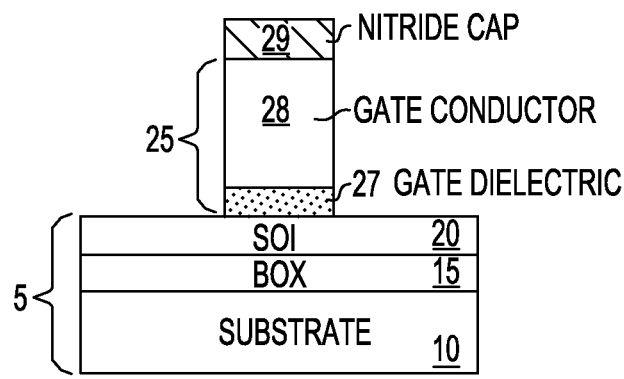
FIG. 2a    START WITH A SUBSTRATE (E.G., ETSOI) FORM GATE STACK WITH A NITRIDE CAP
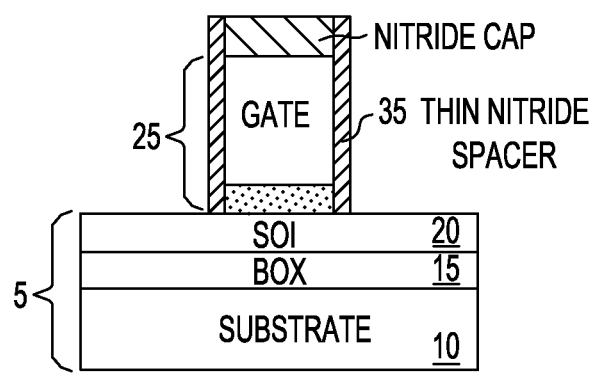
FIG. 2b    FORM THIN SPACER PERFORM EPITAXIAL GROWTH TO FORM STAIR-SHAPE RSD (PREFERABLY THE EPI IS IN-SITU DOPED)

RTP TO DRIVE DOPANTS FROM RSD TO FORM DAMAGE-FREE EXTENSION

METHOD OF FORMING AN EXTREMELY THIN SEMICONDUCTOR INSULATOR (ETSOI) FET HAVING A STAIR-SHAPED RAISED SOURCE/DRAIN

FIELD OF THE INVENTION

The present disclosure relates generally to semiconductor devices, and more specifically, to a field-effect transistor (FET) formed on a semiconductor-on-insulator (SOI) substrate having an epitaxial raised source and drain provided with an extension integrated thereon.

BACKGROUND AND RELATED ART

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Nevertheless, performance improvement brought up by this type of "classic" scaling, in device dimensions, has recently met obstacles and in some cases even been challenged, when the scaling goes beyond a certain point, by the increase in leakage current and variability that are inevitably associated with the continued reduction in device dimensions. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices. Silicon-on-insulator (SOI) technology allows the formation of high-speed, shallow junction devices. In addition, SOI devices improve performance by reducing parasitic junction capacitance.

In an SOI substrate, a buried oxide (BOX) film made of silicon oxide is formed on single crystal silicon, and a single crystal silicon thin film is formed thereon. Various methods of fabricating such SOI substrates are known, one of which is Separation-by-Implanted Oxygen (SIMOX), wherein oxygen is ion implanted into a single crystal silicon substrate to form a BOX film. Another method of forming an SOI substrate is wafer bonding, wherein two semiconductor substrates with silicon oxide surface layers are bonded together at the silicon oxide surfaces to form a BOX layer between the two semiconductor substrates.

Scaling CMOS devices has pushed the number of parameters out of a negligible region to the point of becoming a significant circuit design factors. One of the important device parameters is the short-channel control and Extremely thin Silicon-On-Insulator (ETSOI), both becoming a new class of transistors designed for this propose. ETSOI, a fully depleted charge carriers transistor device uses an ultra-thin silicon channel wherein the majority carriers are fully depleted (FD) during operation.

The thickness of an ETSOI layer typically ranges from 3 nm to 20 nm. Due to the extremely thin SOI layer, the active SD and Extension regions experience create difficulties for dopant implants and activation annealing. Although implants can be conducted, only partial dopants are activated due to lack of silicon re-crystallization. The sheet resistance from both active regions is so elevated that its electrostatic performance is severely degraded.

Scaling of CMOS, particularly thin SOI devices, requires raised source/drain (S/D) to lower the external resistance. Conventional raised S/D comes with the drawback of increased parasitic capacitance between the raised S/D and the gate. Furthermore, in some device structure, for example, extremely thin SOI (ETSOI), the extension resistance becomes the dominant component of total external resistance. The extension resistance can be lowered by thickening the SOI in extension region as well. However, the trade-off has to be made between two competing requirements—lowering external resistance and minimizing the increase of parasitic capacitance.

SUMMARY

In one aspect of the invention, a semiconductor device is formed on a semiconductor-on-insulator (SOI) substrate having a first device region and a second device region, wherein the SOI substrate comprises a semiconductor layer with a thickness ranging from 3 nm to 20 nm. The semiconductor device is characterized by having a raised source region and a raised drain region (RSD).

In another aspect of the invention, a structure is provided that forms an MOSFET device having a stair-shape raised source/drain and extension. The thinner raised extension region next to a thin spacer on gate sidewall lowers the extension resistance without significantly increasing the parasitic resistance. Meanwhile, the thicker raised S/D further lowers the external resistance.

In another aspect of the invention, a single epitaxial growth is performed to form a thinner raised extension and thicker raised S/D simultaneously, thereby lowering the manufacturing cost as well as the contact resistance between the S/D and the extension thereof.

In another aspect, an epitaxial silicon is grown so that the raised source drain abuts against a spacer, providing a vertical boundary between the epitaxial layer and the spacer material. In another aspect, epitaxial silicon is grown so that a facet forms based on the growth mechanism. The structure uses an undercut spacer structure as a template to grow the epitaxial layer.

The present invention further provides an extremely thin semiconductor-on-insulator (ETSOI) device that includes an SOI substrate having a semiconductor layer; a gate formed on the semiconductor layer connected to a spacer formed thereon; and a stair-shaped raised source, a raised drain and a raised extension region abutting at the spacer with the raised extension providing a base supporting the spacer.

Other aspects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a side cross-sectional view of a MOSFET device formed on a semiconductor-on-insulator (SOI) substrate having a unitary stair-shape raised S/D and an extension thereof formed by single epitaxial growth, in accordance with an embodiment of the present invention;

FIGS. 2a-2b are side cross-sectional views showing a demonstrative illustration of an ETSOI substrate having thereon a gate stack with a nitride cap (FIG. 2a) contacting a thin spacer surrounding the gate stack (FIG. 2b), according to an embodiment of the invention.

DETAILED DESCRIPTION

Figure 3A:
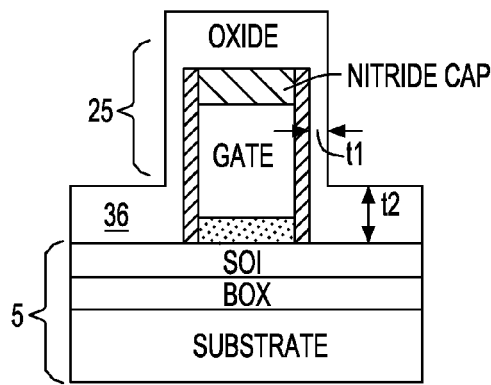
FIG. 3a is a side cross-sectional view illustrating the ETSOI device, wherein a directional deposition forms an oxide layer on the planar surface thicker than the vertical surface (t2>t1).

Detailed embodiments of the present invention are disclosed hereinafter. However, it is to be understood that they are merely illustrative of the invention that may be embodied in various forms. In addition, each of the examples given in connection with the various aspects of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

An illustrative structure and a method for forming semiconductor FET devices on a semiconductor-on-insulator (SOI) substrate are described having an extremely thin semiconductor-on-insulator layer. The extremely thin semiconductor-on-insulator (ETSOI) layer is present atop the buried insulating layer of an SOI substrate, the ETSOI layer having a thickness preferably ranging from 3 nm to 20 nm. The raised source regions and raised drain regions are formed on an upper surface of ETSOI layer in which the semiconductor is present, and which are formed using an epitaxial deposition process.

The epitaxial growth spans over the raised source and drain regions and the upper surface of the resistor body, extending further over the raised source and drain regions of the semiconductor device. An in-situ doping of the epitaxially grown layer allows the dopant concentration to be precisely controlled.

FIG. 1 illustrates the results of the initial processing steps that produce a substrate 5, i.e., semiconductor on insulator (SOI) substrate, in which substrate 5 includes at least a first semiconductor layer 20 (hereinafter referred to as an ETSOI layer) overlying a dielectric layer 15. The ETSOI layer 20 has a thickness preferably less than 10 nm. A second semiconductor layer 10 may be present underlying the dielectric layer 15.

The ETSOI layer 20 is preferably made of any semiconducting material including, but not limited to Si, strained Si, SiC, SiGe, SiGeC, Si alloys, Ge, Ge alloys, GaAs, InAs, and InP, or any combination thereof. The ETSOI layer 20 may be thinned to a desired thickness by planarization, grinding, wet etch, dry etch, oxidation followed by oxide etch, or any combination thereof. One method of thinning the ETSOI layer 20 consists of oxidizing silicon by a thermal dry or wet oxidation process, and then wet etching the oxide layer using preferably a hydrofluoric (HF) acid mixture. This process can be repeated to achieve the desired thickness. The ETSOI layer 20 can have a thickness ranging from 1.0 nm to 10.0 nm, or in another instance, a thickness ranging from 1.0 nm to 5.0 nm, or still another a thickness ranging from 3.0 nm to 8.0 nm. The second semiconductor layer 10 is made of a semiconducting material including, but not limited to Si, strained Si, SiC, SiGe, SiGeC, Si alloys, Ge, Ge alloys, GaAs, InAs, InP as well as other III/V and II/VI compound semiconductors.

The dielectric layer 15 spans the ETSOI layer 20, extending on top the second semiconductor layer 10, preferably formed by implanting a high-energy dopant into the substrate 5 and then annealing the structure to form a buried insulating layer, i.e., dielectric layer 15. Alternatively, the dielectric layer 15 may be deposited or grown prior to the formation of ETSOI layer 20. Substrate 5 can be formed using wafer-bonding techniques, where a bonded wafer pair is formed utilizing glue, adhesive polymer, or direct bonding.

FIG. 1 also depicts forming a gate 25 on substrate 5. As used herein, a "gate" is a structure that defines the geometry of the later formed gate structure that operates the semiconductor device, in which the gate is removed and the gate structure that operates the semiconductor device is formed in its place. Gate 25 includes forming a material stack on the substrate 5. The can include a gate dielectric layer 27 present on the substrate 5, or a gate conductor layer 28 thereon. An optional dielectric cap 29 can also be added on top of layer 28.

The gate dielectric layer 27 can be formed using a deposition process, such as chemical vapor deposition. Variations of CVD processes for depositing the gate dielectric layer 27 include, but are not limited to, Atmospheric Pressure CVD (APCVD), Low Pressure CVD (LPCVD) and Plasma Enhanced CVD (EPCVD), Metal-Organic CVD (MOCVD) and others. In another example, the gate dielectric layer 27 may be formed by a thermal growth process such as, for example, oxidation, nitridation or oxynitridation.

The gate dielectric layer 27 can be made of any dielectric including, but not limited to $SiO_2$, $Si_3N_4$, SiON, and temperature sensitive high-k dielectrics such as $TiO_2$, $Al_2O_3$, $ZrO_2$, $HfO_2$, $Ta_2O_5$, $La_2O_3$; and other similar oxides, or it may be formed using high-k dielectrics. The high-k dielectric may further be made of an oxide, a nitride, an oxynitride or combinations and multi-layers thereof. Alternatively, the high-k dielectric is preferably made by way of a material having a dielectric constant greater than the dielectric constant of silicon oxide, e.g., greater than 4.0 or greater than 7.0. In other applications, the dielectric constant may range from greater than 4.0 to 30. The dielectric constants herein described are relative to a vacuum.

Some examples of high-k dielectric materials suitable for the gate dielectric layer 27 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the gate dielectric layer 27 has a thickness ranging from 1.0 nm to 10.0 nm or a thickness ranging from 2.5 nm to 5.0 nm. In still another example, the gate dielectric layer 27 can be made of hafnium oxide ($HfO_2$), or be structured as a multi-layered structure made of a high-k dielectric layer and a metal nitride gate dielectric. In still other applications it may have a thickness ranging from 0.5 nm to 30 nm, a thickness ranging from 1 nm to 10 nm, or a thickness ranging from 1.5 nm to 5 nm.

The gate conductor 28 is made of conductive material including, but not limited to metals, metal alloys, metal nitrides and metal silicides, as well as laminates thereof and composites thereof. Alternatively. the gate conductor 28 can be made of any conductive metal including, but not limited to, W, Ni, Ti, Mo, Ta, Cu, Pt, Ag, Au, Ru, Ir, Rh, and Re, and alloys that include at least one of the aforementioned conductive elemental metals. The gate conductor 28 may also include doped polysilicon and/or polysilicon-germanium alloy materials (i.e., having a dopant concentration from about $1\times10^{18}$ to about $1\times10^{22}$ dopant atoms per cubic centimeter) and polycide materials (doped polysilicon/metal silicide stack materials). In another version, it can be formed having the same material or different materials. The gate conductor 28 may be formed using a deposition method including, but not limited to, salicide methods, atomic layer deposition methods, chemical vapor deposition methods and physical vapor deposition methods, such as, but not limited to, evaporative methods and sputtering methods. Although the gate conductor 28 is depicted in the supplied figures as being a single layer, other instances have been contemplated in which the gate conductor 28 is a multi-layered structure of conductive materials.

The gate conductor 28 can be formed by one or a combination of following methods: atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of those methods.

As previously described, the material stack may also include a dielectric cap 29 that is present on the second material layer 28, and formed using an oxide, nitride or oxynitride material, and having a thickness ranging from 1 nm to 10 nm. The dielectric cap 29 has preferably a thickness ranging from 2 nm to 5 nm. In one example, the dielectric cap 29 is made of silicon nitride. In another illustration, the dielectric cap 29 may be omitted.

The material stack may be patterned and etch to provide the gate 25. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied.

The etch process, preferably first etches the dielectric cap 29 to provide a hard mask with an etch chemistry that removes the material of the dielectric cap 29 selective to the gate conductor layer 28 and the photoresist mask (not shown). The photoresist mask may then be removed. The remaining portion of the dielectric cap 29 then functions as an etch mask to remove the exposed portions of the gate conductor layer 28 and the gate dielectric layer 27 with etch chemistries that are selective to the substrate 5 and the dielectric cap 29. The etch process that forms the gate 25 is preferably an anisotropic etch, (i.e., a material removal process in which the etch rate in the direction normal to the surface to be etched is greater than in the direction parallel to the surface to be etched). The anisotropic etch may include reactive-ion etching (RIE). Reactive ion etching (RIE) is a form of plasma etching in which during etching the surface to be etched is placed on the RF powered electrode is exposed to reactive gases in the presence of an RF field. Moreover, during RIE the surface to be etched takes on a potential that accelerates the reactive etching species extracted from plasma toward the surface, in which the chemical etching reaction is taking place in the direction normal to the surface. Other examples of anisotropic etching that can be used at this point of the present disclosure include ion beam etching, plasma etching or laser ablation.

The width of the gate 25 may range from 5 nm to 500 nm. In another instance, the width of the gate 25 may range from 10 nm to 100 nm. In yet another, the width of the gate 25 may range from 15 nm to 50 nm.

FIG. 2b depicts one embodiment of forming a spacer 35 adjacent to the sidewalls of the gate 25. The spacer 35 may be made of a nitride, such as silicon nitride. The spacer 35 may be any oxide, nitride or oxynitride material. The spacer 35 may be formed by using a blanket layer deposition and an anisotropic etchback method. It is noted that the material for the spacer 35 may be deposited using any deposition method, e.g., chemical vapor deposition. The spacer 35 may be a single layer or multiple layers.

The width of the spacer 35 ranges from 2 nm to 50 nm, or in another illustration, the width may range from 3 nm to 20 nm, or it may range from 5 nm to 10 nm.

In FIG. 3a, a nitride deposition process is performed to deposit a dielectric film 36 on the structure of FIG. 1. More specifically, an anisotropic deposition using, for example, high density plasma (HDP) techniques is used to form the dielectric film 36, or alternatively using an anisotropic nitride deposition, the dielectric film 36 on the planar surface is thicker than that of the sidewall (e.g., vertical or substantially vertical) surfaces, e.g., t2>t1, wherein t1 can range from about 20 Å to 50 Å, with t2 about two to three times greater than t1. Dielectric film 36 comprises of oxide, with t1 about 30 Å and t2 is about 80 Å. Optionally, a liner (not shown) can be deposited before HDP deposition to prevent high plasma related damage on the SOI layer.

Figure 3B:
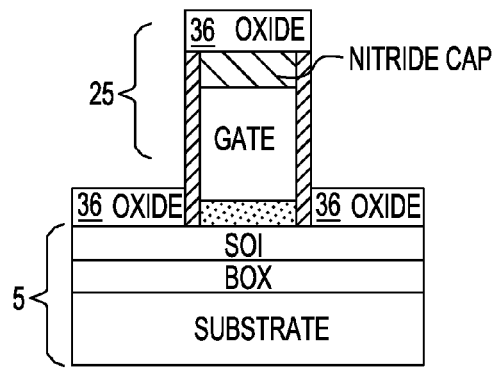
FIG. 3b is a side cross-sectional view of the ETSOI device wherein oxide etch back removes the oxide layer from the vertical sidewall.

FIG. 3b shows an etch back process in accordance with an embodiment of the invention. In this implementation, the dielectric film 36 on the sidewall of gate structure 25 is removed using a conventional etching process, for example, a wet etch process with an etch solution containing hydrofluoric when the dielectric film 36 comprises of silicon oxide. Alternatively, dry etch such as chemical oxide removal (COR) to etch the dielectric film 36. This etching process also removes a portion of the dielectric film 36 on the planar surface.

In one demonstrative illustration, the chemical oxide removal (COR) process may include exposing the structure to a gaseous mixture of hydrofluoric acid (HF) and ammonia (NH4OH). The ratio of hydrofluoric acid (HF) to ammonia (NH4OH) in the chemical oxide removal (COR) process may range from 2.25:1 to 1.75:1 at a pressure between 0.75 mTorr and 15 mTorr at approximately room temperature (25° C.). In one example, the ratio of hydrofluoric acid (HF) to ammonia (NH4OH) in the chemical oxide removal (COR) is 2:1, at a pressure between 1 mTorr and 10 mTorr and a temperature of about 25° C. During this exposure, the HF and ammonia gases react with the sidewall residue that is present on the exposed surface of the dielectric film 36 from the etch process that produced the dummy gate 25 to form a solid reaction product. The solid reaction product is removed in a second step which includes heating the structure to a temperature greater than about 90° C., e.g., 100° C., thus causing the reaction product to evaporate. The reaction product may be removed by rinsing the structure in water, or removing with an aqueous solution.

In a specific, non-limiting example, t1 is about 30 Å and t2 is about 80 Å. In this example, a 40 Å timed oxide etch is used to remove the 30 Å oxide film on the sidewalls of the gate structure 25. This process leaves about a 40 Å thick oxide film on the planar surfaces.

Figure 4A:
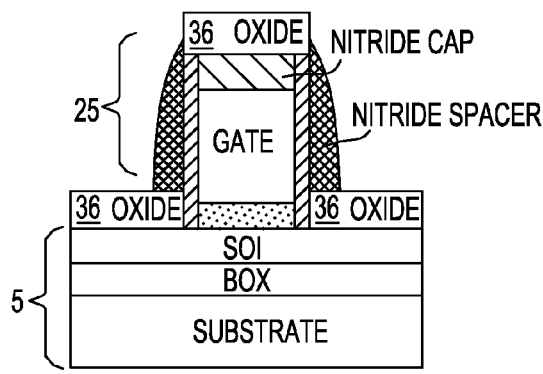
FIGS. 4a-4b are side cross-sectional views depicting the formation of a second nitride spacer (FIG. 4a), followed by an oxide etch removing the HDP oxide (FIG. 4b).

FIG. 4a depicts forming a spacer 37 adjacent to the sidewalls of the gate 25. The spacer 37 may be made of a nitride, such as silicon nitride. The spacer 37 may be any oxide, nitride or oxynitride material. The spacer 37 may be formed by using a blanket layer deposition and an anisotropic etchback method, similar to the method forming the spacer 35 as previously described. The spacer 37 may be a single layer or multiple layers.

Figure 4B:
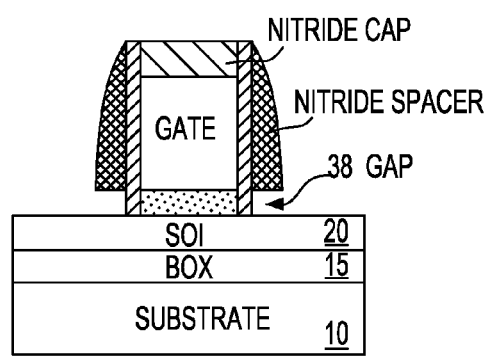

FIG. 4b depicts removing the HDP oxide 36 to create a gap 38 between the nitride spacer 37 and the SOI layer 20. The HDP oxide can be removed by a wet etch made of hydrofluoric acid (HF) or a dry etch such as COR, as descried previously.

Figures 5A, 5B:
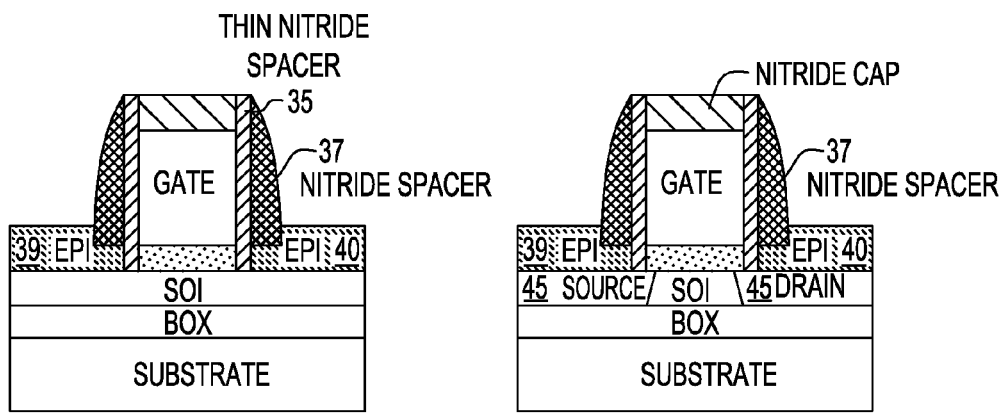
FIG. 5a-5b are side cross-sectional views depicting the formation of an epitaxial growth forming a stair-shape raised source region and raised drain region (RSD) (FIG. 5a), followed by RTP to drive dopants from the RSD to form a damage-free extension.

FIG. 5a depicts forming a stair-shaped raised source region 39 and a raised drain region 40 on the SOI layer 20 adjacent to the first spacer 35 and the second spacer 37. The raised source region 39 and raised drain region 40 are made of in-situ doped semiconductor material that is formed on the ETSOI layer 20 using an epitaxial growth process. When the chemical reactants are controlled and the system parameters set correctly, the depositing atoms arrive at the surface of the ETSOI layer 20 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although higher temperature typically results in faster deposition, the faster deposition may result in crystal defects and film cracking.

An in-situ doped semiconductor material may be provided by selective-epitaxial growth of SiGe atop the ETSOI layer 20. The Ge content of the epitaxial grown SiGe may range from 5% to 60%, by atomic weight %. The Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. The epitaxial grown SiGe produces a compressive strain in the portion of the ETSOI layer 20, in which the channel of a semiconductor device, such as a pFET device, is subsequently formed.

The term "in-situ doped" means that the dopant that provides the conductivity of the raised source regions 39 and raised drain regions 40 is introduced during the epitaxial growth process that provides the semiconductor material of the raised source regions 39 and the raised drain regions 40. The in-situ doped semiconductor material can be doped with a first conductivity type dopant during the epitaxial growth process. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of n-type dopants, i.e., impurities include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

P-type MOSFET devices are produced by doping the in-situ doped semiconductor material for the raised source region 39 and the raised drain region 40 with elements from group III of the Periodic Table of Elements. Group III element can be made of boron, aluminum, gallium or indium. In one example, in which the in-situ doped semiconductor material for the raised source region 39 and the raised drain region 40 is doped to provide a p-type conductivity, the dopant may be boron present in a concentration ranging from $1 \times 10^{18}$ atoms/$cm^3$ to $2 \times 10^{21}$ atoms/$cm^3$. In one example, the in-situ doped semiconductor material is made of SiGe and is doped with boron to provide the raised source region 39 and the raised drain region 40 of a p-type conductivity field effect transistor.

The in-situ doped semiconductor material that provides the raised source region 39 and the raised drain region 40 is made of epitaxially grown Si:C or carbon doped silicon. The carbon (C) content of the epitaxial grown Si:C ranges from 0.3% to 5%, by atomic weight %. The carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. The epitaxial grown Si:C produces a tensile strain in the ETSOI layer 20, in which the channel of a semiconductor device, such as an nFET device, is subsequently formed.

The in-situ doped semiconductor material is doped with a second conductivity type dopant during the epitaxial growth process. N-type MOSFET devices are produced by doping the in-situ doped semiconductor material with elements from group V of the Periodic Table of Elements. The group V element is phosphorus, antimony or arsenic.

Although the raised source region 39 and the raised drain region 40 have been described using an in-situ doping process, the raised source region 39 and the raised drain region 40 may also be formed by depositing an undoped semiconductor layer and then introducing p-type or n-type dopant into the undoped semiconductor layer with ion implantation or gas phase doping FIG. 5b further depicts diffusing dopant from the in-situ doped semiconductor material of the raised source region 39 and the raised drain region 40 into the ETSOI layer 20 to form extension regions 45. The dopant from the in-situ doped semiconductor material is diffused into the ETSOI layer 20 by an annealing processes including, but not limited to, rapid thermal annealing, furnace annealing, flash lamp annealing, laser annealing, or any suitable combination of thereof. Thermal annealing to diffuse the dopant from the in-situ doped semiconductor material into the ETSOI layer 20 is conducted at a temperature ranging from 850° C. to 1350° C.

In-situ doped semiconductor material is doped to a p-type conductivity, the extension regions 45 that are formed in the ETSOI layer 20 have a p-type conductivity. Typically, the dopant concentration of the extension regions 45 having the p-type conductivity ranges from $1\times10^{19}$ atoms/cm$^3$ to $2\times10^{21}$ atoms/cm$^3$. The extension regions 45 having the p-type conductivity have a dopant concentration ranging from $2\times10^{19}$ atoms/cm$^3$ to $5\times10^{20}$ atoms/cm$^3$.

The in-situ doped semiconductor material is doped to an n-type conductivity, the extension regions 45 that are formed in the ETSOI layer 45 have an n-type conductivity. Typically, the dopant concentration of the extension regions 45 having the n-type conductivity ranges from $1\times10^{19}$ atoms/cm$^3$ to $2\times10^{21}$ atoms/cm$^3$. The extension regions 45 having the n-type conductivity have a dopant concentration ranging from $2\times10^{19}$ atoms/cm$^3$ to $5\times10^{20}$ atoms/cm$^3$.

The extension regions 45 have a depth that extends the entire depth of the ETSOI layer 20. Therefore, the extension regions 45 have a depth of less than 10 nm, typically being 2 nm to 8 nm in depth, as measured from the upper surface of the ETSOI layer 20. Although the extension regions 45 are described above as being formed by diffusing dopant from the raised source region 39 and the raised drain region 40 into the ETSOI layer 20, the extension regions 45 may also be formed by ion implanting of n-type or p-type dopants into the ETSOI layer 20 after forming the dummy gate 25, and before forming the raised source region 39 and the raised drain region 40.

Although only one device is shown, this invention can also be used to form integrated circuits with more than one device. For example, by adding conventional patterning techniques, both n-type MOSFET and p-type MOSFET can be formed on the same chip.

While the methods and structures disclosed herein have been particularly shown and described with respect to preferred embodiments thereof, it will be understood by those skilled in the art that the foregoing and other changes in forms and details may be made without departing from the spirit and scope of the present disclosure. It is therefore intended that the methods and structures disclosed herein not be limited to the exact forms and details described and illustrated, but fall within the scope of the appended claims.

What is claimed is:

1. A method of forming an ETSOI semiconductor device comprising:
    providing a substrate comprising at least a semiconductor layer atop a dielectric layer, wherein the semiconductor layer has a thickness of less than 10 nm;
    forming isolation regions through the semiconductor layer into contact with the dielectric layer to define at least a first surface of the semiconductor layer and a second surface of the semiconductor layer;
    forming a gate structure on a portion of the first surface of the semiconductor layer, wherein a remaining portion of the first surface is exposed;
    epitaxially growing a single crystal semiconductor material on the remaining portion of the first surface and the second surface of the semiconductor layer, wherein the single crystal semiconductor material on the remaining portion of the first surface provides a raised source region and a raised drain region of a semiconductor device, and the single crystal semiconductor material on the second surface provides an upper surface of a resistor;
    forming a dielectric layer on a portion of the upper surface of the resistor, wherein end portions of the upper surface of the resistor are exposed; and
    forming semiconductor metal alloy contacts on at least the end portions of the upper surface of the resistor and an upper surface of the raised source region and the raised drain region of the semiconductor device.

2. The method of claim 1 wherein the single crystal semiconductor material is in-situ doped during the epitaxial growing of the single crystal semiconductor material.

3. The method of claim 1, further comprising doping the single crystal semiconductor material by ion implantation of a p-type or n-type dopant.

4. The method of claim 1, wherein the forming of the gate structure comprises depositing at least one gate dielectric layer, depositing at least one gate conductor layer on the at least one gate dielectric layer, forming a photoresist mask overlying the at least one gate conductor layer, and etching the at least one gate conductor layer and the at least one gate conductor layer using an etch that is selective to the photoresist mask and the semiconductor layer.

5. The method of claim 1 further comprising forming an extension source region and an extension drain region in the semiconductor layer.

6. The method of claim 1, wherein the metal semiconductor alloy is a silicide.

7. The method of claim 1, wherein a dopant concentration of the single crystal semiconductor material of the resistor ranges from $1\times10^{17}$ cm$^{-3}$ to $5\times10^{20}$ cm$^{-3}$.

8. The method of claim 1, wherein the at least the first surface and the second surface of the semiconductor layer further comprises a third surface and a fourth surface, wherein the semiconductor device on the first surface is a first conductivity semiconductor device, the resistor on the second surface is a first conductivity resistor, the third surface comprises a second conductivity resistor, and the fourth surface comprises a second conductivity semiconductor device.

9. The method of claim 8 wherein the first conductivity comprises a p-type dopant, and the second conductivity comprises an n-type dopant.

* * * * *